United States Patent [19]

Romano-Moran

[11] 4,438,157

[45] Mar. 20, 1984

[54] PROCESS FOR FORMING MNOS DUAL DIELECTRIC STRUCTURE

[75] Inventor: Roberto Romano-Moran, Centerville, Ohio

[73] Assignee: NCR Corporation, Dayton, Ohio

[21] Appl. No.: 396,995

[22] Filed: Jul. 12, 1982

Related U.S. Application Data

[63] Continuation of Ser. No. 213,764, Dec. 5, 1980, abandoned, which is a continuation-in-part of Ser. No. 83,499, Oct. 10, 1979, abandoned.

[51] Int. Cl.$^3$ .................. H01L 21/316; H01L 21/318
[52] U.S. Cl. ...................................... 427/93; 427/94; 427/95
[58] Field of Search .......................... 427/93-95

[56] References Cited

U.S. PATENT DOCUMENTS

| | | | |
|---|---|---|---|
| 3,924,024 | 12/1975 | Naber et al. | 427/95 |
| 4,151,537 | 4/1976 | Goldman et al. | 357/23 |
| 4,279,947 | 7/1981 | Goldman et al. | 427/255.2 |

OTHER PUBLICATIONS

W. Kern et al., "Advances in Deposition Processes for Passivation Films", J. Vac. Sci. Tech., vol. 14, No. 5, Sep./Oct. 1977, pp. 1082-1099.

A. Bhattacharyya, "FET Gate Structure for Nonvolatile N-Channel Read-Mostly Memory Device", IBM Tech. Discl. Bull., vol. 18, Nov. 1975, p. 1768.

P. Chen, "Threshold-Alterable Si-Gate MOS Devices", IEEE Trans. on El. Devices, vol. ED-24, No. 5, May 1977, pp. 584-586.

*Primary Examiner*—John D. Smith
*Attorney, Agent, or Firm*—J. T. Cavender; Casimer K. Salys; T. Rao Coca

[57] ABSTRACT

A process for forming memory quality silicon dioxide and silicon nitride dual-dielectric structures in the same LPCVD furnace system by: forming the silicon dioxide at atmospheric pressure at a temperature of 700°-850° using dry oxygen; heat treating the silicon dioxide layer in ammonia; and forming silicon nitride at 400-600 millitorr and 700°-850° C. using dichlorosilane and ammonia. Optionally, a dielectric layer of silicon oxynitride can be formed on the oxide by using N$_2$O, ammonia and dichlorosilane obtaining a memory device with improved retention and endurance.

1 Claim, 1 Drawing Figure

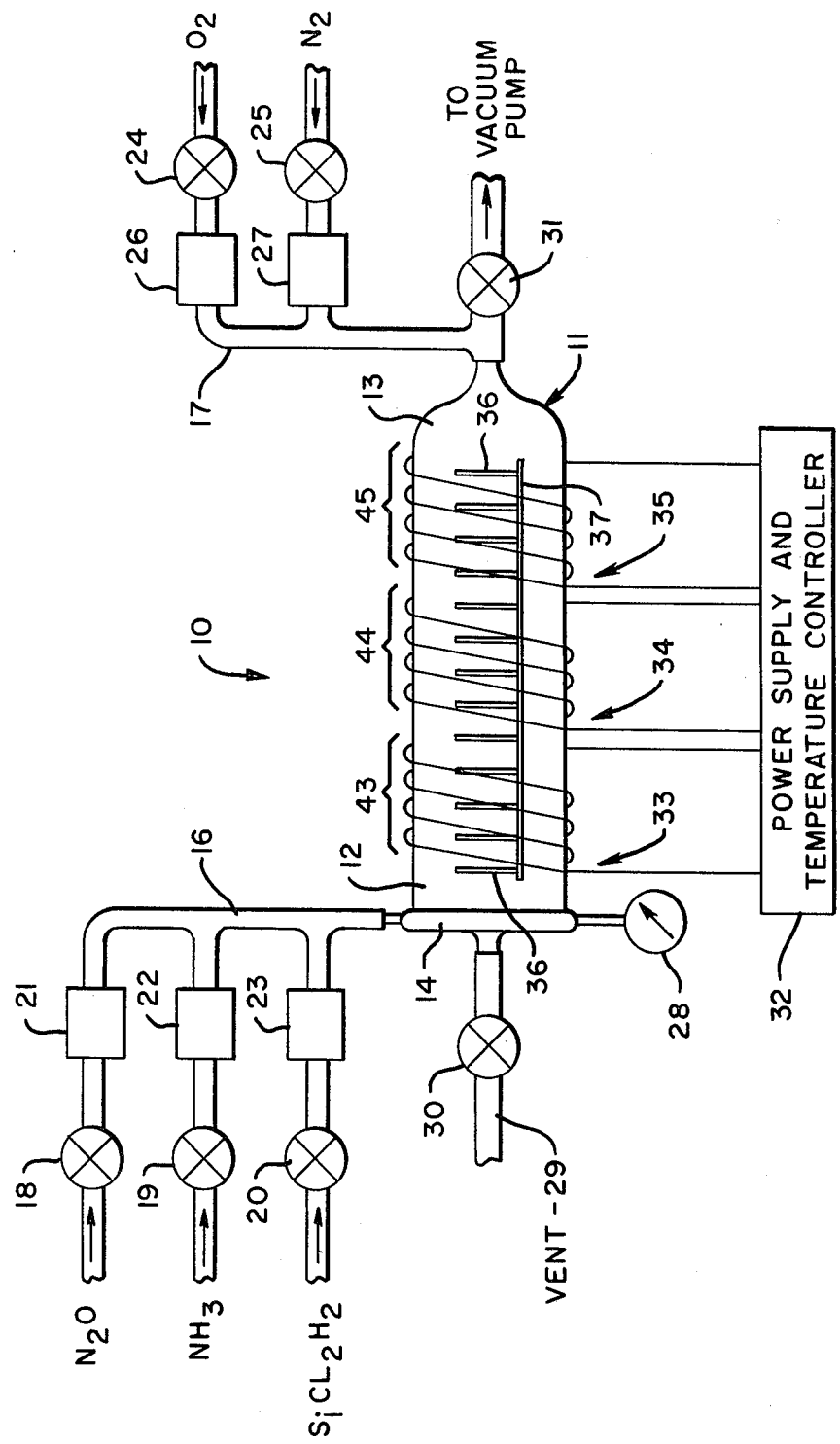

PROCESS FOR FORMING MNOS DUAL DIELECTRIC STRUCTURE

CROSS REFERENCE TO RELATED APPLICATION

This application is a continuation of application Ser. No. 213,764, filed Dec. 5, 1980, now abandoned, which is a continuation-in-part of the copending application Ser. No. 083,499 filed Oct. 10, 1979, now abandoned.

BACKGROUND OF THE INVENTION

The invention relates to the formation of silicon dioxide and silicon nitride dual dielectric structures of the type used in MNOS (metal-nitride-oxide-semiconductor) structures and, more particularly, to a process for forming memory-quality silicon dioxide and silicon nitride dual dielectric structures in the same deposition system.

In the past, the high quality silicon nitride films required in MNOS memory technology have been obtained principally by the atmospheric chemical vapor deposition technique. (Note, as used here, MNOS includes silicon gate structures, SNOS.) In the last few years there has been increasing interest in low pressure chemical vapor deposition of silicon nitride using reactants such as ammonia ($NH_3$) and dichlorosilane ($SiCl_2H_2$) or silane ($SiH_4$). As discussed, for example, in the Journal of Vacuum Science Technology, Vol. 14, No. 5, September/October 1977 page 1089, surface reaction is the rate determining factor in the low pressure technique rather than mass transfer, which is critical in atmospheric pressure techniques. Elimination of mass-transfer variables and such constraints as reactor configuration permits optimization of reactor design for temperature uniformity and wafer throughput. Consequently, the low pressure process typically uses a resistance-heated tube furnace to take advantage of the uniform temperatures and the large potential throughput (provided by the large deposition zones as well as the close-packed vertical wafer loading) of such furnaces.

It is highly desirable to more fully utilize these advantages during the formation of memory MNOS structures by forming the silicon dioxide dielectric as well as the silicon nitride dielectric in the same furnace tube using essentially a continuous process. Such a process would avoid the time lost in transferring wafers between deposition systems. This includes time lost in reducing the oxidation system temperature to near-room temperature prior to removal of the wafer(s) from the oxidation system, transferring the wafers to the nitride deposition system, and then raising the temperature of the nitride deposition system. Another factor is the possible change and/or degradation in oxide characteristics due to the elongated exposure to elevated temperatures, in oxidizing and/or impurity-containing atmosphere. Perhaps more importantly, using the same furnace tube to form the oxide and the nitride would avoid or prevent $Si$—$SiO_2$—$Si_3N_4$ interface contamination.

Full utilization of the potential advantages of forming the oxide and nitride in the same furnace tube requires that the two dielectrics be formed at, or near, the same temperature, to eliminate the long stabilization times characteristic of resistance-heated furnaces and thereby both save time and avoid prolonged exposure of the silicon dioxide layer to the furnace atmosphere.

Unfortunately, using the same temperature for the silicon dioxide and silicon nitride formation involves different, frequently conflicting, problems and considerations. First, the thin (e.g. 15–25 Angstroms 1.5–2.5 nanometer, nm) memory oxide must be formed at a relatively low temperature because growth at elevated temperatures would be too rapid for adequate control of thickness.

Secondly, low silicon nitride formation temperatures are also desirable, to reduce mechanical stresses caused by the different thermal expansions of silicon and silicon nitride and to provide the proper memory retention characteristics of the film, such as the density and energy position of the charge trapping centers in the nitride.

Another consideration is applicable to MNOS formation in general, viz., that the use of elevated temperatures in forming the silicon dioxide and the silicon nitride can adversely affect existing structure. For example, high temperatures can modify or degrade existing logic gates and FET structures and/or cause migration of existing impurity regions such as sources and drains. Note also that in the case of the silicon nitride formation these existing structures include the thin silicon dioxide memory gate dielectric.

Unfortunately, a countervailing consideration is that low temperatures not only cause poor stoichiometry and high $Q_{SS}$ (because of longer oxidation times at lower temperatures) for the silicon substrate-silicon dioxide interface, but also give lower growth rates and lesser quality silicon nitride.

SUMMARY OF THE INVENTION

It is one object of the present invention to form silicon dioxide and silicon nitride dual dielectric memory structures using an essentially continuous process, at or near the same temperature, in the same deposition system.

These and other objects are accomplished by forming the memory silicon dioxide dielectric at atmospheric pressure at a temperature of 700°–850° C. in a dry oxygen ambient, then forming the memory silicon nitride dielectric by reacting ammonia and a silicon-containing gas such as dichlorosilane at or near the oxidation temperature, at a pressure of approximately 400–600 millitorr.

This continuous process can be used to form a dielectric layer between the oxide and the nitride using a reactant mixture of $N_2O$, ammonia and dichlorosilane. The resulting structure has improved retention and endurance characteristics.

BRIEF DESCRIPTION OF THE DRAWING

FIG. 1 is a schematic representation of an LPCVD system suitable for forming silicon dioxide and silicon nitride dual dielectric structures in accordance with the method of the present invention.

DETAILED DESCRIPTION

The present invention relates to a unique method for forming silicon dioxide and silicon nitride dielectric layers. The method is suitable for incorporation into any process for forming MNOS gate structures in which the silicon nitride is formed directly after the silicon dioxide in the process sequence. Since various overall processes are well-known in the art and are not the subject of the present invention, they will not be discussed here. Instead, the description will focus on the method of forming the oxide and nitride dual dielectric structure.

FIG. 1 is a schematic representation of a three-zone furnace system 10 suitable for depositing silicon dioxide and silicon nitride in accordance with the method of the present invention.

The system 10 comprises an LPCVD furnace including a furnace tube 11, typically made of fused quartz, having first and second ends 12 and 13 and a cover 14 at the first end. Inert and reactant gases are admitted to the tube 11 via manifolds 16 and 17. That is, $N_2O$, $NH_3$ and $SiCl_2H_2$ are admitted to manifold 16 via valves 18, 19, and 20, respectively, and their flow rates are controlled by conventional electronic mass flow controllers 21, 22 and 23. Similarly, oxygen and nitrogen are admitted to manifold 17 via valves 24 and 25 and their flow rates are controlled by mass flow controllers 26 and 27. Of course, other arrangements will be readily devised by those skilled in the art. Vacuum gauge 28 is connected to the interior of the tube for providing readings of the internal pressure.

In the exemplary arrangement shown in FIG. 1, vent 29 is opened and closed by valve 30 to allow the exit of oxygen and nitrogen from the tube 11 during the wafer loading and oxidation and unloading cycles.

The manifold 17 has a gate valve 31 for controlling the connection of the tube 11 to a vacuum pump (not shown). The path of movement of gases along the tube is axial, from the end 12 to the end 13 for nitride deposition or from end 13 to end 12 during oxidation and wafer loading.

A power supply and temperature control 32 provides electrical power to resistance heating coils 33-35 for heating three corresponding internal zones 43-45 of the tube 11 and for growing silicon dioxide or silicon nitride, depending upon the gas reactants entering via manifold 16 or 17.

An example of a three-zone furnace system which employs the arrangement shown in FIG. 1 is the Model 85304, available from Lindberg-Tempress Corporation, 1803 N. Meridian Street, Indianapolis, Ind. 46202. This furnace system was modified for LPCVD as shown in FIG. 1. The tubes typically are about 82 inches long (208 cm.) and about 5½ inches (14 cm.) in inside diameter. Each tube can hold about 120 four inch-diameter (10.2 cm.) wafers. The heating zones 43, 44 and 45 span approximately 70 inches (178 cm.) of the tube 11. Although the temperature profile of such a tubular, resistance-heated furnace is inherently quite uniform, the three-zone approach provides independent control of the temperatures within the individual zones and thus permits attainment of a flat or graded temperature profile along the length of the tube 11.

As shown in dotted outline in FIG. 1, wafers 36—36 are supported in boat 37 with their major surfaces at right angles to the axis of the tube and the direction of gas flow. This arrangement permits a close-packed loading which contributes to the high wafer throughput of the system 10.

An exemplary sequence of steps which has been used for forming the oxide-nitride dual dielectric structure in both p-channel and n-channel processes is as follows:

1. A silicon substrate 36 is prepared for deposition, for example, by etching the surface in a 1:10 solution of HF and deionized water for perhaps fifteen seconds, followed by rinsing in deionized water for perhaps twenty minutes and drying using a spin dry cycle.

2. The memory quality silicon dioxide is then formed by positioning the silicon wafers 36—36 on boat 37, and inserting the boat into the furnace at atmospheric pressure, at a temperature of about 750° C., in the presence of an oxidizing ambient provided by a flow of pure dry oxygen of about 8 slm (standard liters per min.) The flow rate is given for the particular furnace system and may vary, e.g., for furnace tubes of a different size. Using the above-described equipment and dry thermal oxidation conditions controllably provides an oxide film of 10 to 30 Angstroms in a matter of a few minutes.

3. Next, the furnace pressure is reduced to about 400-500 millitorr and ammonia is allowed to flow through the tube 11 at a rate of about 70 sccm. The ammonia flow is maintained for a short time to prevent back-flow of the dichlorosilane gas (which will be introduced in a subsequent step) into the otherwise evacuated ammonia lines where a prereaction of ammonia and dichlorosilane could take place. Such a reaction would result in an undesirable clogging of the mass flow controllers and other meters and valves associated therewith. Ammonia flow under atmospheric pressure conditions is known to improve the memory characteristics as described in U.S. Pat. No. 3,924,024, which patent is assigned to the assignee of the present invention. However, in contrast to U.S. Pat. No. 3,924,024 which uses ammonia flow to eliminate forming oxynitride over the oxide, the present invention uses ammonia to prevent a prereaction.

4. The LPCVD silicon nitride is then grown to the desired thickness by adding dichlorosilane to the ammonia flow at an approximate 3.5:1 ammonia:dichlorosilane ratio (typically about 70 sccm ammonia to 20 sccm dichlorosilane) using the 750° C. temperature. These conditions provide a silicon nitride deposition rate of about 24 Angstroms per minute. Typical nitride thickness, which is determined by the type of channel and scaling of the device, is 100-650 Angstroms.

5. Finally, the furnace tube is backfilled with nitrogen to atmospheric pressure and the wafers are withdrawn using a slow pull cycle of perhaps five minutes to avoid exposure of the wafers to share temperature gradients.

The advantages of the above-described process are numerous. First, performing the oxide and nitride growth processes in the same furnace provides time and step savings and, perhaps most importantly for memory MNOS structures, greatly enhances the quality of the interface between the dielectric layers and between the silicon dioxide and the silicon substrate (wafer). Secondly, adaptation of the combined steps to the LPCVD furnace system insures a large wafer throughput and excellent temperature and thickness uniformity. Thirdly, the temperature used throughout the process allows sufficient time for formation of the thin memory oxide to accurately control the thickness of the oxide and also prevents modifying the electrical characteristics of the $SiO_2$ interface of other, previously formed logic gates or field-effect transistors. This relatively low temperature still provides sufficiently high deposition rates for the silicon nitride and excellent retentivity and endurance characteristics.

Finally, another advantage of the oxide-nitride growth process is that a layer of oxynitride can be formed on the oxide as part of the process in the same furnace tube. The resulting structure is MNOOS or SNOOS.

It has been discovered that a dielectric layer can be formed consistent with the aims of a continuous, low temperature process, before the deposition of the silicon nitride (step 4) by introducing N₂O and dichlorosilane in addition to ammonia to form a silicon oxynitride layer, on the oxide. For the above-described furnace system, typical flow rates would be up to 100 sccm N₂O, 70 sccm ammonia, and 20 sccm dichlorosilane depending on the stoichiometry desired of the oxynitride. Resulting growth rates will depend on the deposition temperature and reactants flow rates. At 750° C., oxynitride deposition rates would be in the vicinity of 20 Angstroms per minute. Typical oxynitride thickness is in the range 50–200 Angstroms. Because the additional dielectric layer formation step is conveniently done in the same furnace tube and at or near the temperature and pressure used for the nitride deposition and thus requires only switching of the reactants, it too is accomplished with a minimum of time and steps.

In one example of forming a multilayer structure using the process of this invention, an oxynitride layer is formed over the silicon dioxide layer. In this example, first, as discussed above, the memory oxide layer of thickness 10–30 Å is formed by dry thermal oxidation, in the presence of pure oxygen flow, of the silicon substrates 36—36 supported in the furnace tube 11 which is maintained at atmospheric pressure and temperature of about 750° C. Next, the furnace pressure is reduced to about 400–500 millitorr and ammonia is allowed to flow through the tube for a short period of time. As mentioned, the ammonia flow is necessary to prevent backflow of dichlorosilane which is introduced into the tube in the immediately following step, into the otherwise-evacuated ammonia line and a prereaction of dichlorosilane and ammonia which can clog the metering and valve system. Then, LPCVD oxynitride is formed over the oxide by simultaneously introducing into the furnace tube dichlorosilane and N₂O mixture using the 750° C. temperature. The N₂O:dichlorosilane:ammonia proportion is typically about 1:2:7. Typical thickness of the oxynitride so formed is in the range 50–200 Angstroms. Next, as discussed above, the LPCVD silicon nitride is formed by cutting off the flow of N₂O and maintaining in the furnace tube an ammonia:dichlorosilane ratio of approximately 3.5:1 and using the 750° C. temperature. Typical thickness of the nitride so formed is in the range 300–650 Angstroms.

The following Table I provides summaries of suitable parameters for the thermal oxidation, nitride and oxynitride depositions for both p-channel and n-channel processes.

TABLE I

| Process Parameters | |
|---|---|
| Memory silicon dioxide (dry thermal silicon oxidation) | |
| pressure | atmospheric |
| temperature | 700–850° C. |
| ambient | dry oxygen |
| Silicon nitride (LPCVD) | |
| pressure | 400–600 millitorr |
| temperature | 700–850° C. |
| reactants ratio | (3–4):1 NH₃:SiH₂Cl₂ |
| Silicon oxynitride (LPCVD) | |
| pressure | 400–600 millitorr |
| temperature | 700–850° C. |
| reactants ratio | (1–3):2:7 N₂O:SiH₂Cl₂:NH₃ |

Tables II and III below provide a summary of the retentivity and endurance characteristics of various n-channel devices formed in accordance with the process of the present invention. In these tables the structure designated as SNOS refers to a polysilicon-nitride-oxide-semiconductor structure; SNOOS refers to a polysilicon-nitride-oxynitride-oxide-semiconductor structure; and SONOS refers to a polysilicon-oxynitride-nitride-oxide-semiconductor structure. The SONOS structure was formed in a manner similar to that for forming the SNOOS structure except that the oxynitride layer was deposited over the nitride rather than over the oxide. The process parameters used for depositing the oxynitride layer in both of these multidielectric structures were the same.

TABLE II

| | Write/Erase Voltage: ±20 volts, 1 ms | | | | | | Write/Erase Voltage: ±20 volts, 10 ms | | | | | |
|---|---|---|---|---|---|---|---|---|---|---|---|---|
| | Uncycled Devices | | | Devices cycled 10⁶ times | | | Uncycled Devices | | | Devices cycled 10⁶ times | | |
| | Decay Rate (V/Decade) | | | | | | | | | | | |
| Structure | Write State | Erase State | Total | Write State | Erase State | Total | Write State | Erase State | Total | Write State | Erase State | Total |
| SNOS* | 0.60 | 0.24 | 0.84 | 0.56 | 0.31 | 0.87 | 0.70 | 0.45 | 1.15 | 0.67 | 0.52 | 1.19 |
| SNOOS** | 0.48 | 0.22 | 0.70 | 0.49 | 0.33 | 0.82 | 0.61 | 0.39 | 1.00 | 0.60 | 0.48 | 1.08 |
| SONOS* | 0.55 | 0.23 | 0.78 | 0.57 | 0.31 | 0.88 | 0.69 | 0.46 | 1.15 | 0.66 | 0.51 | 1.17 |

*Memory implant dose = 3.2 × 10¹² ions/sq. cm.
**Memory implant dose = 1.2 × 10¹² ions/sq. cm.

TABLE III

| | Write/Erase Voltage: ±20 volts, 1 ms | | | | | | Write/Erase Voltage: ±20 volts, 10 ms | | | | | |
|---|---|---|---|---|---|---|---|---|---|---|---|---|
| | Uncycled Devices | | | Devices cycled 10⁶ times | | | Uncycled Devices | | | Devices cycled 10⁶ times | | |
| | Decay Rate (V/Decade) | | | | | | | | | | | |
| Structure | Write State | Erase State | Total | Write State | Erase State | Total | Write State | Erase State | Total | Write State | Erase State | Total |
| SNOS | 0.58 | 0.11 | 0.69 | 0.51 | 0.27 | 0.78 | 0.69 | 0.31 | 1.0 | 0.58 | 0.48 | 1.06 |
| SNOOS | 0.45 | 0.19 | 0.64 | 0.43 | 0.31 | 0.74 | 0.59 | 0.37 | 0.96 | 0.55 | 0.47 | 1.02 |
| SONOS | 0.46 | 0.22 | 0.68 | 0.44 | 0.34 | 0.78 | 0.62 | 0.43 | 1.05 | 0.56 | 0.53 | 1.09 |

Each of the memory devices shown in Tables II and III was implanted with low doses of ions during the course of fabrication of the peripheral circuitry associated with the device and prior to their introduction into the furnace tube. These implantations consisted of an enhancement implantation through a thick (600–700 Å) gate oxide using boron ions of energy 30 Kev and dose 3.5 × 10¹¹ ions/sq. cm. and a depletion implantation through the gate oxide using phosphorus ions of energy 100 Kev and dose $1.2 \times 10^{12}$ ions/sq. cm. The devices shown in Table II were additionally subjected to a memory implantation to adjust the device threshold voltage and center the device memory window as close to zero as possible. This memory implantation was accomplished using boron ions of energy 30 Kev and dose in the range $1.2 \times 10^{12}$ to $3.2 \times 10^{12}$ ions/sq. cm. as indicated in Table II.

The retentivity and endurance curves of the various devices were taken at 100° C. by reading periodically their threshold voltage variation after initialization with a write or erase voltage pulse. During writing or erasing the substrate, the source and the drain were maintained at ground potential and a positive or negative potential of 20 volts was respectively applied to the gates. The onset of a 20 microamp drain-source current was taken as indicating that the devices were on and, thus, determined the threshold voltage. The devices were maintained at zero gate bias when they were not being interrogated. In all of the devices tested and compared with each other in the analysis that follows, the total initial window was essentially the same. Tables II and III were constructed using the retentivity and endurance curves.

It is obvious from Table II that the memory implanted SNOOS structure formed using the process of the present invention exhibits a lower memory window decay rate than that of the SNOS device. For example, referring to the data obtained using a write/erase pulse of ±20 volts and 1 msec, the SNOS device has a decay rate for its memory window of 0.84 volts/decade, whereas the corresponding decay rate for the SNOOS device is 0.70 volts/decade. This indicates that the SNOOS device has superior retention than the SNOS device. The data also shows that the SNOOS device has a better retention than the SONOS device. Additionally, a similar pattern in the decay rate is observed when these devices were subjected to a cycling of up to $10^6$ times (using a square wave of amplitude ±20 volts and pulse width 1 msec), thereby indicating that the SNOOS device also has better endurance over the SNOS and SONOS devices. It is realized that SNOOS device was subjected to a memory implant dosage of $1.2 \times 10^{12}$ ions/sq. cm. while the SNOS and SONOS devices were given a dose of $3.2 \times 10^{12}$ ions/sq. cm., but experience indicates that this small difference in the dosage is not the cause for the improved retentivity and endurance characteristics of the SNOOS device.

The data of Table III, which pertains to devices without memory implantation, shows also that the SNOOS device formed using the process of the present invention has better retention and endurance than the SNOS and SONOS devices.

While the reason for the improved retention and endurance of the SNOOS structure is not understood, it is believed that the unique temperature and pressure parameters and the continuous nature of forming the various layers significantly improved the quality of the interfaces between the layers, thereby enhancing the memory performance.

Thus, the process of this invention not only forms an MNOS device in an essentially continuous fashion thereby overcoming many of the disadvantages associated with prior processes, but also forms a multilayer memory structure with improved memory characteristics.

Having thus described a preferred method for practicing the growth technique of the present invention, including exemplary and preferred parameter ranges, what is claimed is:

1. A process for forming continuously in the same furnace deposition tube a silicon dioxide, silicon oxynitride and silicon nitride memory device dielectric structure on a silicon substrate comprising:

thermally oxidizing the silicon substrate in the furnace tube in a dry oxygen ambient atmospheric pressure in the range of 700°–850° C.;

forming immediately thereafter the silicon oxynitride layer on the silicon dioxide using gaseous reactants in the proportion (1–3):2:7 of $N_2O$, dichlorosilane and ammonia, said ammonia being introduced first into the furnace tube to prevent spurious deposits during this step, at the same temperature used for forming the silicon dioxide layer and a pressure of 400–600 millitorr; and forming immediately thereafter the silicon nitride layer on the silicon oxynitride by cutting off the $N_2O$ gas supply to the furnace tube and using the gaseous ammonia and dichlorosilane in the ratio of (3–4):1 at the same temperature and same range of pressure used for forming the silicon oxynitride layer.

* * * * *